(12) United States Patent
Leon

(10) Patent No.: US 8,203,393 B1
(45) Date of Patent: Jun. 19, 2012

(54) VOLTAGE CONTROLLED OSCILLATOR OPEN LOOP COARSE AMPLITUDE CONTROL WITH RESPECT TO PROCESS AND TEMPERATURE VARIATIONS

(75) Inventor: Christopher R. Leon, Irvine, CA (US)

(73) Assignee: QUALCOMM Atheros, Inc., San Jose, CA (US)

( * ) Notice: Subject to any disclaimer, the term of this patent is extended or adjusted under 35 U.S.C. 154(b) by 105 days.

(21) Appl. No.: 12/272,149

(22) Filed: Nov. 17, 2008

Related U.S. Application Data

(60) Provisional application No. 60/989,667, filed on Nov. 21, 2007.

(51) Int. Cl.
*H03K 3/354* (2006.01)
(52) U.S. Cl. .............................. 331/176; 331/66; 331/57
(58) Field of Classification Search .................. 331/176, 331/65, 66, 57
See application file for complete search history.

(56) References Cited

U.S. PATENT DOCUMENTS

| | | | |
|---|---|---|---|
| 6,326,855 B1 * | 12/2001 | Jelinek et al. | 331/57 |
| 6,515,551 B1 * | 2/2003 | Mar et al. | 331/111 |
| 7,102,342 B2 * | 9/2006 | Kim | 323/316 |
| 7,463,101 B2 * | 12/2008 | Tung | 331/57 |
| 2005/0258910 A1 * | 11/2005 | Tung | 331/18 |

* cited by examiner

*Primary Examiner* — Joseph Chang
(74) *Attorney, Agent, or Firm* — Bay Area Technology Law Group PC

(57) ABSTRACT

A voltage controlled oscillator having a temperature and process controlled output. A VCO in accordance with the present invention comprises a reference current source, a fixed current source, coupled in series with the reference current source, the fixed current source comprising a temperature independent current source, a third current source, coupled in parallel with the combination of the reference current source and the fixed current source, and an oscillator, coupled in series with the third current source, wherein a current used to control the oscillator is based on operating temperatures and processes of the reference current source and the third current source.

12 Claims, 4 Drawing Sheets

VOLTAGE CONTROLLED OSCILLATOR OPEN LOOP COARSE AMPLITUDE CONTROL WITH RESPECT TO PROCESS AND TEMPERATURE VARIATIONS

CROSS-REFERENCE TO RELATED APPLICATIONS

This application claims the benefit under 35 U.S.C Section 119(e) of U.S. Provisional Application Ser. No. 60/989,667, filed on Nov. 21, 2007, by Christopher L. Leon, entitled "VOLTAGE CONTROLLED OSCILLATOR OPEN LOOP COARSE AMPLITUDE CONTROL WITH RESPECT TO PROCESS AND TEMPERATURE VARIATIONS," which application is incorporated by reference herein.

BACKGROUND OF THE INVENTION

1. Field of the Invention

The present invention relates generally to Global Positioning System (GPS) receivers, and in particular, to a voltage controlled oscillator (VCO) open loop coarse amplitude control with respect to process and temperature variations.

2. Description of the Related Art

The use of GPS in consumer products has become commonplace. Hand-held devices used for mountaineering, automobile navigation systems, and GPS for use with cellular telephones are just a few examples of consumer products using GPS technology.

As GPS technology is being combined with these devices, the GPS chips are being placed in widely ranging temperature environments. Further, some of the GPS portions are being made on the same semiconductor chip as other portions of the combined devices, which subjects the GPS portions of these electronic devices to widely-varying semiconductor processing steps. Since the GPS portion of the chips are temperature and process dependent, it becomes more difficult to produce a large yield of semiconductor chips with GPS functionality.

One of the temperature and process dependent portions of the GPS functionality is the voltage controlled oscillator that is required for GPS quadrature modulation and demodulation. As the temperature of the chip changes, or the processing across the wafer changes, the output of the VCO signals changes, which introduces errors in the GPS calculations.

Further, because GPS usage has been placed in new products, other issues, such as lower signal strength of the received signals has become an issue.

It can be seen, then, that there is a need in the art for a VCO that can generate signals that are less temperature dependent. It can also be seen that there is a need in the art for a VCO that can generate signals that are less process dependent.

SUMMARY OF THE INVENTION

To minimize the limitations in the prior art, and to minimize other limitations that will become apparent upon reading and understanding the present specification, the present invention discloses a voltage controlled oscillator having a temperature and process controlled output. A VCO in accordance with one or more embodiments of the present invention comprises a reference current source, a fixed current source, coupled in series with the reference current source, the fixed current source comprising a temperature independent current source, a third current source, coupled in parallel with the combination of the reference current source and the fixed current source, and an oscillator, coupled in series with the third current source, wherein a current used to control the oscillator is based on operating temperatures and processes of the reference current source and the third current source.

Such a VCO further optionally comprises the reference current source comprises a bandgap-based voltage generator, the reference current source further comprises a resistor having temperature and process variations, the third current source compensates for temperature and process variations, the third current source compensates for temperature and process variations in a manner opposite that of the reference current source, and a current generated by the fixed reference source is greater than a reference current generated by the reference current source.

A voltage controlled oscillator having a variable current control for controlling the output of the voltage controlled oscillator in accordance with one or more embodiments of the present invention comprises a current source, comprising at least a reference current source and a fixed current source, wherein a current from the current source is based on operating temperatures and processes of the reference current source.

Such a voltage controlled oscillator further optionally includes the current source further comprising at least a third current source, and the current from the current source is further based on operating temperatures and processes of the third current source, the third current source compensating for temperature and process variations, the third current source compensating for temperature and process variations in a manner opposite that of the reference current source, the reference current source comprising a bandgap-based voltage generator, and the reference current source further comprising a resistor having temperature and process variations.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

When an inductor-capacitor based Voltage Controlled Oscillator (LC VCO) is biased with a typical current source, the amplitude of oscillation from the LC VCO may vary drastically with process and temperature variations. This variance in amplitude makes it more difficult to design the circuits that use this amplitude to perform various functions.

One way to minimize the amplitude variation and expand the use of the LC VCO is to apply excess biasing current to the LC VCO such that in all conditions the LC VCO output supplies the minimum required amplitude. This approach then uses excess current at other process corners and temperatures.

To avoid this limitation, the present invention varies the amount of current supplied to the VCO based on the process and the temperature at which the LC VCO operates.

Description

The present invention uses a variable biasing current to generate a proper bias for the LC VCO at various process and temperature operating points.

Figure 1:
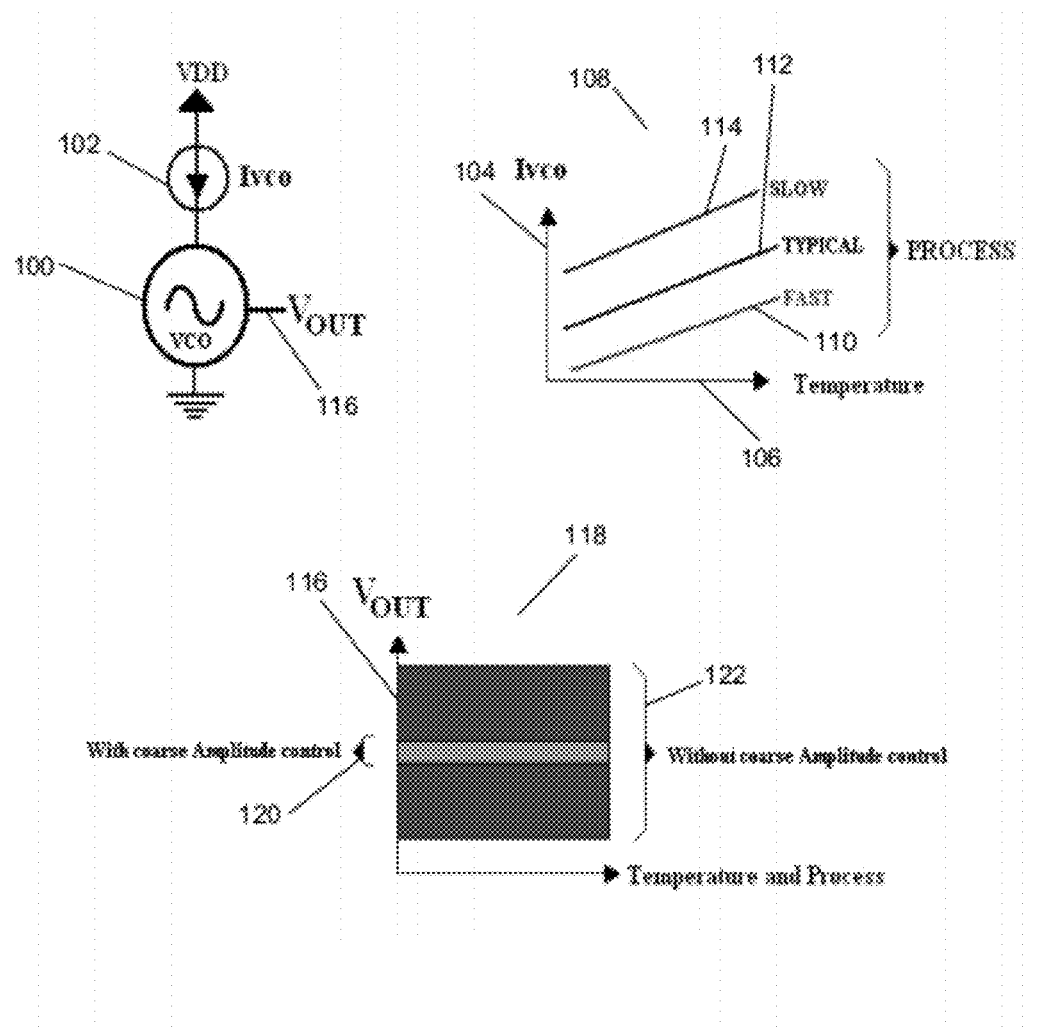
FIG. 1 illustrates the operation of a VCO in accordance with the present invention.

FIG. 1 illustrates the operation of a VCO in accordance with the present invention.

VCO 100 is biased by current source 102. Depending on the process corner and the temperature 106, the biasing current 104 delivered to VCO 100 is based on graph 108. So, for example, at the fast process corner 110, the VCO 100 requires less biasing current from current source 102 than with respect to a typical process corner 112. Further, when the temperature 106 is lower, the VCO requires less biasing current than when the temperature 106 is higher for any of the process corners 110-114. Similarly, when the process corner 114 is slow, the VCO 100 requires more current compared to the typical process corner 112.

To maintain continuous coarse amplitude control at the VCO 100 output 116, the present invention supplies the biasing current from current source 102 to the VCO 100 as shown in graph 108, and the result is that the output voltage 116 amplitude swings are reduced as shown in graph 118, namely, the output voltage 116 is limited to band 120, rather than unlimited in band 122.

Figure 2:
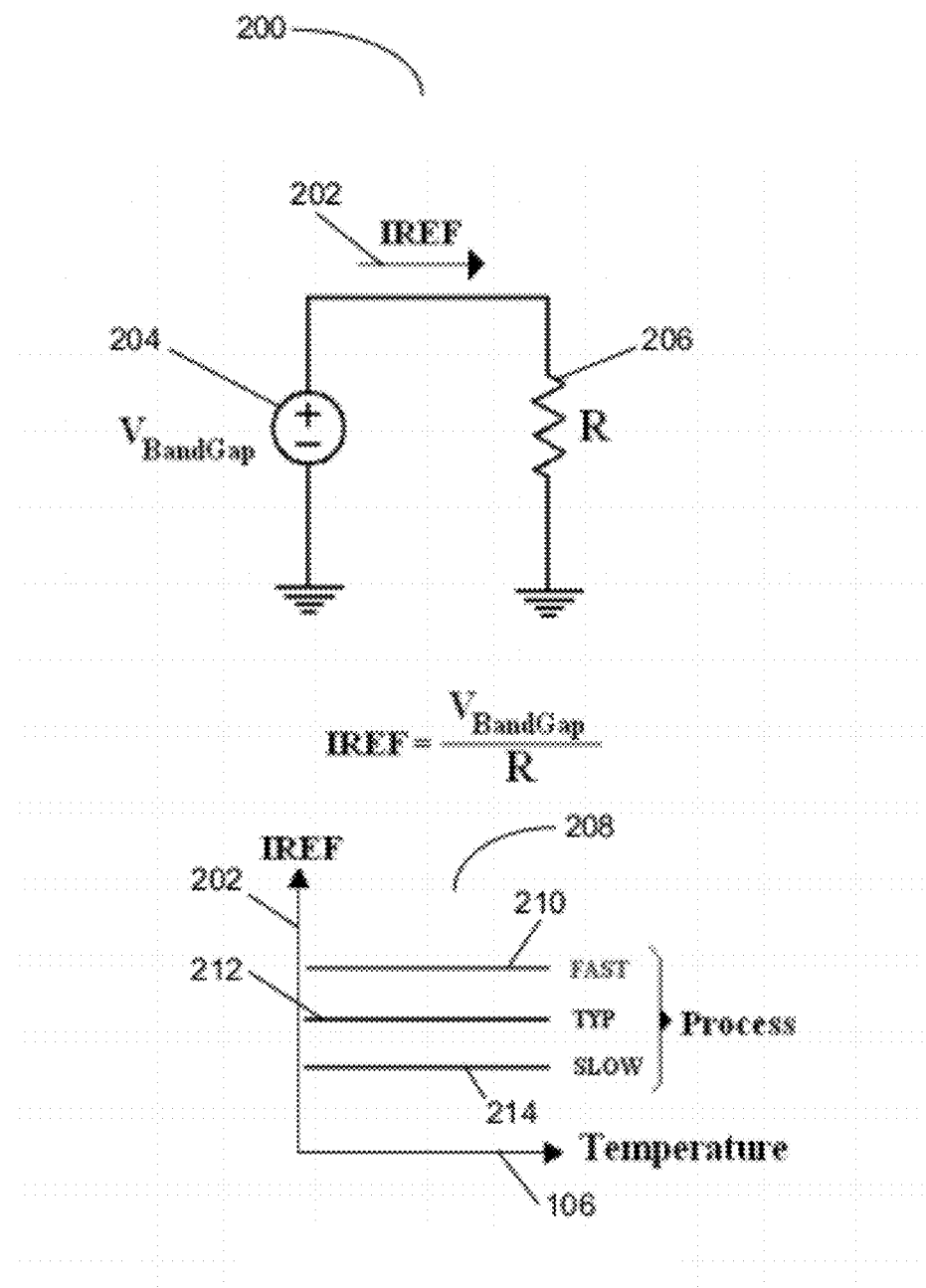
FIG. 2 illustrates a portion of the variable current source in accordance with the present invention.

FIG. 2 illustrates a portion of the variable current source 102 in accordance with the present invention.

Current source 200 generates current 202 by taking a fixed voltage 204, such as from a BandGap circuit ($V_{BandGap}$), and applying this voltage to a resistor 206, which varies with process and temperature, to generate a current called IREF 202.

As shown in graph 208, in the fast process corner 210 the resistor 206 is smaller, generating higher current 202 compared to a typical process corner 212, and when the process corner is slow 214, the resistor 206 is larger generating a lower current compared to the typical process corner 212. As such, the current 202 varies by temperature 106 and process corners 210-214 of the resistor 206.

Because the resistor 206 value depends on the process corners, the resistor value is lower at a "fast process" because, among other things, the dimensions of resistor 206 are smaller, and at the "slow process" corner, the value of the resistor 206 is higher because the physical dimensions of resistor 206 are bigger. Since the resistor 206 value is based on the process corner, the current through the resistor changes based on the process corner automatically.

Figure 3:
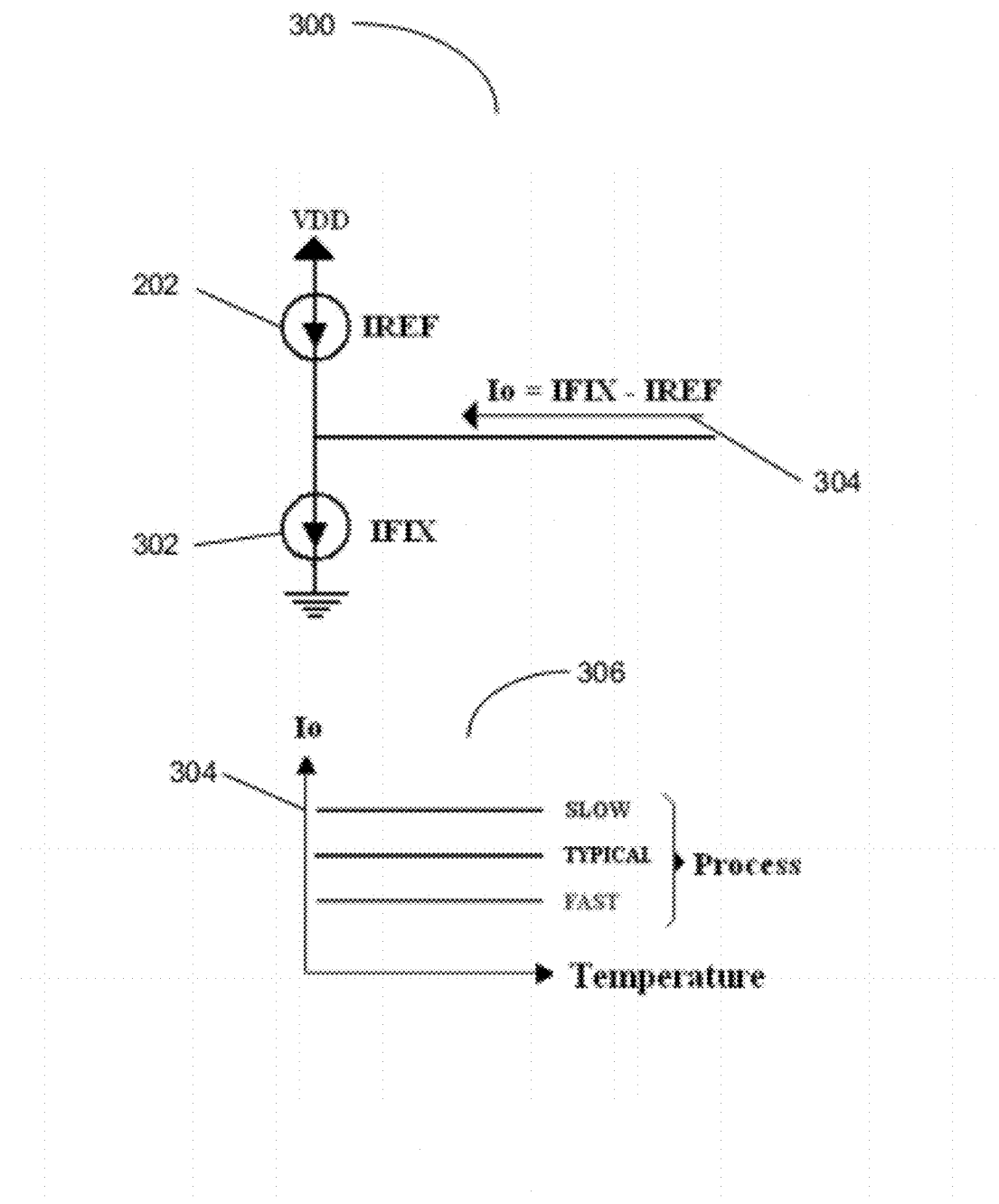
FIG. 3 illustrates a second portion of the current source of the present invention.

FIG. 3 illustrates a second portion of the current source of the present invention.

To generate the proper current for the VCO 100, the current needed to correct against process variations must be larger for slow process corners and smaller for fast process corners. To accomplish this, current source 300 uses the current 202 generated over the resistor R 206 (i.e., IREF 202 described in FIG. 2) and subtracts current 202 from a fixed current IFIX 302, which is independent of process and temperature. Typically, current 302 is larger than current 202 IREF. This generates current 304, which is shown in graph 306.

Figure 4:
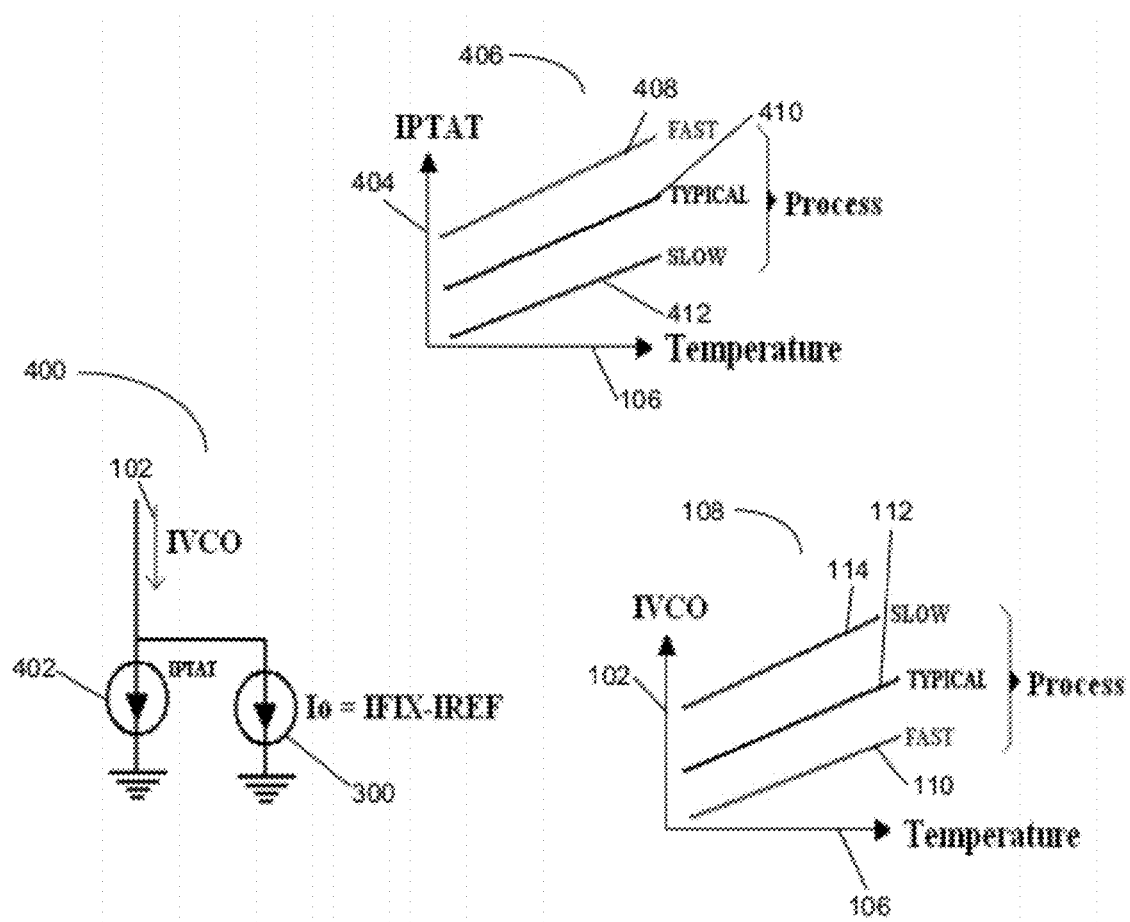
FIG. 4 illustrates another portion of the current source of the present invention.

FIG. 4 illustrates another portion of the current source of the present invention.

To correct against temperature changes, a current that is proportional to temperature, device 400, which connects current source IPTAT 402 to current source 300 of FIG. 3, is fabricated. By coupling IPTAT 402 to current source 300, current 102 is generated. IPTAT currents 402 are generated by allowing the current source 402 to vary with temperature as a standard current source. However, the addition in parallel of current source 300 now allows current source 400 to compensate for the voltage swing variation in VCO 100. As shown in graph 406, fast 408, typical 410, and slow 412 process current v. temperature curves are generated by current source 402.

Applications of the Present Invention

This invention is useful when coarse amplitude control is sufficient to reduce the constraints of the circuits that use the VCO 100 output voltage 116. One example is the mixer of a Global Positioning System (GPS) receiver, where the gain conversion of the mixer is affected by the VCO 100 amplitude. The GPS receiver requires that the amplitude be within some limits and without amplitude control as provided by the present invention, performance of the mixer is degraded. The present invention is also useful in situations where power consumption and area are limited, e.g., battery powered devices.

The current sources of the present invention can be fabricated as Metal-Oxide-Semiconductor (MOS) devices or bipolar junction devices. Further, the MOS devices can be of N-type (NMOS) or P-type (PMOS), a mixture of NMOS and PMOS, or true Complimentary MOS (CMOS).

CONCLUSION

In summary, a voltage controlled oscillator having a temperature and process controlled output in accordance with one or more embodiments of the present invention comprises a reference current source, a fixed current source, coupled in series with the reference current source, the fixed current source comprising a temperature independent current source, a third current source, coupled in parallel with the combination of the reference current source and the fixed current source, and an oscillator, coupled in series with the third current source, wherein a current used to control the oscillator is based on operating temperatures and processes of the reference current source and the third current source.

Such a VCO further optionally comprises the reference current source comprises a bandgap-based voltage generator, the reference current source further comprises a resistor having temperature and process variations, the third current source compensates for temperature and process variations, the third current source compensates for temperature and process variations in a manner opposite that of the reference current source, and a current generated by the fixed reference source is greater than a reference current generated by the reference current source.

A voltage controlled oscillator having a variable current control for controlling the output of the voltage controlled oscillator in accordance with one or more embodiments of the present invention comprises a current source, comprising at least a reference current source and a fixed current source, wherein a current from the current source is based on operating temperatures and processes of the reference current source.

Such a voltage controlled oscillator further optionally includes the current source further comprising at least a third current source, and the current from the current source is further based on operating temperatures and processes of the third current source, the third current source compensating for temperature and process variations, the third current source compensating for temperature and process variations in a manner opposite that of the reference current source, the reference current source comprising a bandgap-based voltage generator, and the reference current source further comprising a resistor having temperature and process variations.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but by the claims appended hereto and the equivalents thereof.

What is claimed is:

1. A voltage controlled oscillator having a temperature and process controlled output, comprising: a reference current source; a fixed current source, coupled in series with the reference current source, the fixed current source comprising a temperature independent current source; a third current source, coupled in parallel with the combination of the reference current source and the fixed current source; and an oscillator, coupled in series with the third current source, wherein a current used to control the oscillator is based on operating temperatures and processes of the reference current source and the third current source and wherein each of the current sources is independent of each other.

2. The voltage controlled oscillator of claim 1, wherein the reference current source comprises a bandgap-based voltage generator.

3. The voltage controlled oscillator of claim 2, wherein the reference current source further comprises a resistor having temperature and process variations.

4. The voltage controlled oscillator of claim 3, wherein the third current source compensates for temperature and process variations.

5. The voltage controlled oscillator of claim 4, wherein the third current source compensates for temperature and process variations in a manner opposite that of the reference current source.

6. The voltage controlled oscillator of claim 5, wherein a current generated by the fixed reference source is greater than a reference current generated by the reference current source.

7. A voltage controlled oscillator having a variable current control for controlling the output of the voltage controlled oscillator, comprising: a current source biasing the voltage controlled oscillator, comprising at least a reference current source and a fixed current source, wherein the reference current source and the fixed current source are coupled in series, wherein a current from the reference current source is based on operating temperatures and processes of the reference current source, and wherein each of the current sources is independent of each other.

8. The voltage controlled oscillator of claim 7, wherein the current source further comprises at least a third current source, and the current from the current source is further based on operating temperatures and processes of the third current source.

9. The voltage controlled oscillator of claim 8, wherein the third current source compensates for temperature and process variations.

10. The voltage controlled oscillator of claim 9, wherein the third current source compensates for temperature and process variations in a manner opposite that of the reference current source.

11. The voltage controlled oscillator of claim 7, wherein the reference current source comprises a bandgap-based voltage generator.

12. The voltage controlled oscillator of claim 7, wherein the reference current source further comprises a resistor having temperature and process variations.

* * * * *